United States Patent
Kim (10) Patent No.: US 10,171,203 B2
(45) Date of Patent: Jan. 1, 2019

(54) APPARATUS AND METHOD FOR RECEIVING SIGNAL IN COMMUNICATION SYSTEM SUPPORTING LOW DENSITY PARITY CHECK CODE

(71) Applicant: Samsung Electronics Co., Ltd., Suwon-si (KR)

(72) Inventor: Sang-Min Kim, Uiwang-si (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/907,223

(22) PCT Filed: Jul. 22, 2014

(86) PCT No.: PCT/KR2014/006659
§ 371 (c)(1),
(2) Date: Jan. 22, 2016

(87) PCT Pub. No.: WO2015/012572
PCT Pub. Date: Jan. 29, 2015

(65) Prior Publication Data
US 2016/0197701 A1    Jul. 7, 2016

(30) Foreign Application Priority Data

Jul. 22, 2013 (KR) .......................... 10-2013-0085860

(51) Int. Cl.
*H03M 13/00* (2006.01)
*H04L 1/00* (2006.01)
*H03M 13/11* (2006.01)

(52) U.S. Cl.
CPC ....... *H04L 1/0045* (2013.01); *H03M 13/1102* (2013.01); *H03M 13/114* (2013.01); *H03M 13/116* (2013.01); *H03M 13/1111* (2013.01)

(58) Field of Classification Search
CPC ............ H04L 1/0045; H03M 13/1102; H03M 13/1111; H03M 13/116
See application file for complete search history.

(56) References Cited

U.S. PATENT DOCUMENTS 6,567,465 B2 *   5/2003   Goldstein .......... H03M 13/1148
                                              375/222
7,581,157 B2 *   8/2009   Oh .................... H03M 13/1148
                                              714/781

(Continued)

FOREIGN PATENT DOCUMENTS

KR       10-1108062        2/2012

OTHER PUBLICATIONS

International Search Report for PCT/KR2014/006659 dated Oct. 27, 2014.

(Continued)

*Primary Examiner* — Esaw T Abraham
(74) *Attorney, Agent, or Firm* — The Farrell Law Firm, P.C.

(57) ABSTRACT

The present disclosure relates to a pre-$5^{th}$-generation (5G) or 5G communication system to be provided for supporting higher data rates Beyond $4^{th}$-generation (4G) communication system such as long term evolution (LTE). A method for receiving a signal in a signal receiving apparatus in a communication system supporting a low density parity check (LDPC) code is provided. The method includes receiving a signal from a signal transmitting apparatus; and performing an LDPC decoding operation which is based on a preset first parity check matrix on the received signal, wherein the first parity check matrix is generated based on a second parity check matrix including a plurality of sub-matrices.

12 Claims, 9 Drawing Sheets (56) References Cited

U.S. PATENT DOCUMENTS

| | | | |
|---|---|---|---|
| 8,028,216 B1* | 9/2011 | Yeo | H03M 5/145 |
| | | | 714/755 |
| 8,185,807 B2* | 5/2012 | Oh | H03M 13/1148 |
| | | | 714/781 |
| 8,347,170 B2* | 1/2013 | Chung | H03M 13/114 |
| | | | 714/752 |
| 8,392,786 B2* | 3/2013 | Trachewsky | H03M 13/6544 |
| | | | 714/752 |
| 8,719,655 B2* | 5/2014 | Blasco Claret | H03M 13/116 |
| | | | 714/752 |
| 8,996,965 B2* | 3/2015 | Yosoku | H03M 13/1137 |
| | | | 714/780 |
| 2005/0289437 A1 | 12/2005 | Oh et al. | |
| 2006/0020870 A1 | 1/2006 | Hocevar | |
| 2007/0011565 A1 | 1/2007 | Kim et al. | |
| 2007/0038914 A1 | 2/2007 | Bickerstaff et al. | |
| 2008/0052594 A1 | 2/2008 | Yedidia et al. | |
| 2011/0246849 A1 | 10/2011 | Rault et al. | |

OTHER PUBLICATIONS

Casado et al., "Multiple-Rate Low-Density Parity-Check Codes With Constant Blocklength", IEEE Transactions on Communications, vol. 57, No. 1, Jan. 1, 2009.

* cited by examiner

FIG.1

$$H = \begin{bmatrix} \begin{array}{ccc|ccc|c|ccc} & 1 & & & 2 & & \cdots & & N & \\ 0 & 0 & 0 & 0 & 0 & 1 & & 0 & 0 & 0 \\ 0 & 0 & 0 & 1 & 0 & 0 & \cdots & \cdots & 0 & 0 & 0 \\ 0 & 0 & 0 & 0 & 1 & 0 & & 0 & 0 & 0 \\ \hline 0 & 0 & 0 & 0 & 1 & 0 & & 0 & 0 & 0 \\ 0 & 0 & 0 & 0 & 0 & 1 & \cdots & \cdots & 0 & 0 & 0 \\ 0 & 0 & 0 & 1 & 0 & 0 & & 0 & 0 & 0 \\ \hline 1 & 0 & 0 & 0 & 0 & 0 & & 0 & 0 & 0 \\ 0 & 1 & 0 & 0 & 0 & 0 & \cdots & \cdots & 0 & 0 & 0 \\ 0 & 0 & 1 & 0 & 0 & 0 & & 0 & 0 & 0 \\ \hline & \vdots & & & & & & & \vdots & \\ \hline 0 & 1 & 0 & 0 & 0 & 0 & & 0 & 0 & 1 \\ 0 & 0 & 1 & 0 & 0 & 0 & \cdots & \cdots & 1 & 0 & 0 \\ 1 & 0 & 0 & 0 & 0 & 0 & & 0 & 1 & 0 \\ \hline 0 & 0 & 0 & 0 & 0 & 1 & & 0 & 1 & 0 \\ 0 & 0 & 0 & 1 & 0 & 0 & \cdots & \cdots & 0 & 0 & 1 \\ 0 & 0 & 0 & 0 & 1 & 0 & & 1 & 0 & 0 \end{array} \end{bmatrix} \begin{matrix} 1 \\ \\ 2 \\ \\ \\ \\ \vdots \\ \\ \\ \\ M \end{matrix}$$

APPARATUS AND METHOD FOR RECEIVING SIGNAL IN COMMUNICATION SYSTEM SUPPORTING LOW DENSITY PARITY CHECK CODE

RELATED APPLICATION(S)

This application is a National Phase Entry of PCT International Application No. PCT/KR2014/006659 filed on Jul. 22, 2014, the contents of which are incorporated herein by reference.

TECHNICAL FIELD

The present disclosure relates to an apparatus and method for receiving a signal in a communication system supporting a low density parity check (LDPC) code. More particularly, the present disclosure relates to a signal receiving apparatus for decoding an LDPC code using a shuffled decoding algorithm and method thereof in a communication system supporting the LDPC code.

BACKGROUND

To meet the demand for wireless data traffic having increased since deployment of 4G ($4^{th}$-Generation) communication systems, efforts have been made to develop an improved 5G ($5^{th}$-Generation) or pre-5G communication system. Therefore, the 5G or pre-5G communication system is also called a 'beyond 4G network' or a 'post LTE system'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), full dimensional MIMO (FD-MIMO), array antenna, an analog beam forming, large scale antenna techniques are discussed in 5G communication systems.

In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like.

In the 5G system, hybrid FSK and QAM modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

Figure 1:
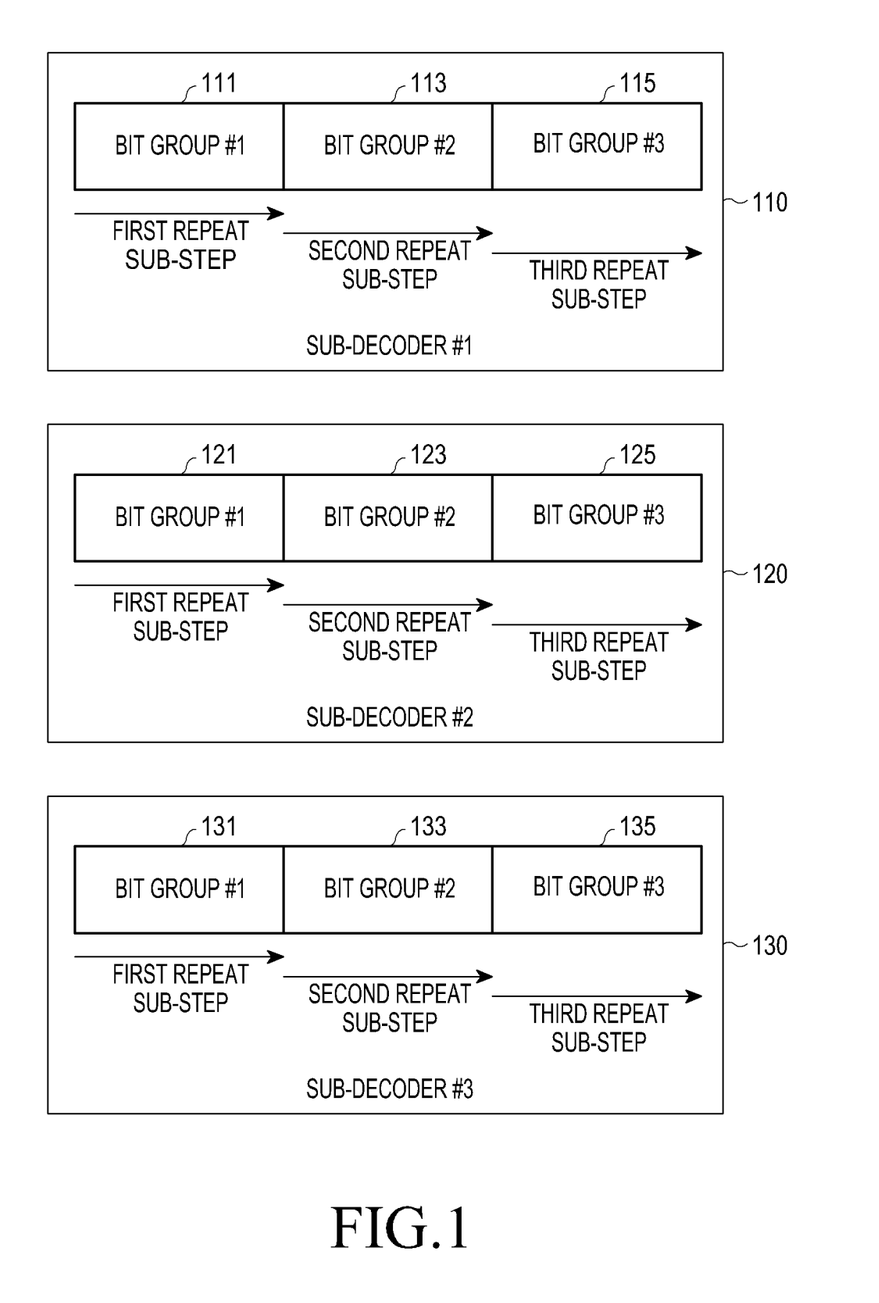
FIG. 1 schematically illustrates an inner structure of a signal receiving apparatus in a conventional communication system supporting an LDPC code.

FIG. 1 schematically illustrates an inner structure of a signal receiving apparatus in a conventional communication system supporting an LDPC code.

Referring to FIG. 1, the signal receiving apparatus in FIG. 1 is a signal receiving apparatus including replicated group-shuffled sub-decoders, and this will be described.

The signal receiving apparatus includes a sub-decoder #1 110, a sub-decoder #2 120, and a sub-decoder #3 130. Each of the sub-decoder #1 110, the sub-decoder #2 120, and the sub-decoder #3 130 includes three bit groups. That is, the sub-decoder #1 110 includes a bit group #1 111, a bit group #2 113, and a bit group #3 115, the sub-decoder #2 120 includes a bit group #1 121, a bit group #2 123, and a bit group #3 125, and the sub-decoder #3 130 includes a bit group #1 131, a bit group #2 133, and a bit group #3 135.

In FIG. 1, bit groups used in each of the sub-decoder #1 110, the sub-decoder #2 120, and the sub-decoder #3 130 are identical, however, update orders used in each of the sub-decoder #1 110, the sub-decoder #2 120, and the sub-decoder #3 130 are different.

In the sub-decoder #1 110, bit estimates included in the bit group #1 111 are updated in the first repeat sub-step, bit estimates included in the bit group #2 113 are updated in the second repeat sub-step, and bit estimates included in the bit group #3 115 are updated in the third repeat sub-step.

In the sub-decoder #2 120, bit estimates included in the bit group #2 123 are updated in the first repeat sub-step, bit estimates included in the bit group #3 125 are updated in the second repeat sub-step, and bit estimates included in the bit group #1 121 are updated in the third repeat sub-step.

In the sub-decoder #3 130, bit estimates included in the bit group #3 135 are updated in the first repeat sub-step, bit estimates included in the bit group #1 131 are updated in the second repeat sub-step, and bit estimates included in the bit group #2 133 are updated in the third repeat sub-step.

That is, the signal receiving apparatus in FIG. 1 divides input bits into lower groups which have the same size which is less than the number of columns included in a parity check matrix for the LDPC code used in the communication system, i.e., a column size to perform a decoding operation in three sub-decoders. In this case, each of the sub-decoder #1 110, the sub-decoder #2 120, and the sub-decoder #3 130 needs a "message from a variable node to a check node (variable-to-check message)" in order to update a "message from a check node to a variable node (check-to-variable message)".

As such, the signal receiving apparatus needs many memory read/write operations in order to read/write messages from/to a memory or a register.

If the communication system is an application system which needs a high data processing rate, the signal receiving apparatus should use many memory banks.

As such, a shuffled LDPC decoding algorithm needs a variable-to-check message which is lastly updated and variable-to-check messages which are just before updated, and the signal receiving apparatus consumes much power due to a structure which performs a memory read/write operation and has a storage device corresponding to this.

The above information is presented as background information only to assist with an understanding of the present disclosure. No determination has been made, and no assertion is made, as to whether any of the above might be applicable as prior art with regard to the present disclosure.

SUMMARY

An aspect of the present disclosure is to address at least the above-mentioned problems and/or disadvantages and to provide at least the advantages described below. Accordingly, an aspect of the present disclosure is to provide an apparatus and method for receiving a signal in a communication system supporting an LDPC code.

Another aspect of the present disclosure is to provide a signal receiving apparatus for decoding an LDPC code using a shuffled decoding algorithm and method thereof in a communication system supporting the LDPC code.

Another aspect of the present disclosure is to provide an apparatus and method for receiving a signal thereby using low power in a communication system supporting an LDPC code.

In accordance with an aspect of the present disclosure, a signal receiving apparatus in a communication system supporting a low density parity check (LDPC) code is provided. The signal receiving apparatus includes a receiver configured to receive a signal from a signal transmitting apparatus; and an LDPC decoder configured to perform an LDPC decoding operation which is based on a preset first parity check matrix on the received signal, wherein the first parity check matrix is generated based on a second parity check matrix including M×N sub-matrices, wherein the first parity check matrix includes non-zero matrices among the M×N sub-matrices included in the second parity check matrix, wherein the non-zero matrices are expressed as an n_c form, n denotes a number of blocks included in the second parity check matrix, and c denotes a number of non-zero matrices included in an $n^{th}$ block column included in the second parity check matrix, and wherein the first parity check matrix includes a preset number of partial matrices, and each of the partial matrices includes a preset number of non-zero sub-matrices on a block column of the second parity check matrix basis.

In accordance with another aspect of the present disclosure, a signal receiving apparatus in a communication system supporting a low density parity check (LDPC) code is provided. The signal receiving apparatus includes an LDPC decoder configured to perform an LDPC decoding operation on an input signal based on a preset first parity check matrix, wherein the first parity check matrix is generated based on a second parity check matrix including M×N sub-matrices, wherein the first parity check matrix includes non-zero matrices among the M×N sub-matrices included in the second parity check matrix, wherein the non-zero matrices are expressed as an n_c form, n denotes a number of blocks included in the second parity check matrix, and c denotes a number of non-zero matrices included in an $n^{th}$ block column included in the second parity check matrix, and wherein the first parity check matrix includes a preset number of partial matrices, and each of the partial matrices includes a preset number of non-zero sub-matrices on a block column of the second parity check matrix basis.

In accordance with another aspect of the present disclosure, a method for receiving a signal in a signal receiving apparatus in a communication system supporting a low density parity check (LDPC) code is provided. The method includes receiving a signal from a signal transmitting apparatus; and performing an LDPC decoding operation which is based on a preset first parity check matrix on the received signal, wherein the first parity check matrix is generated based on a second parity check matrix including M×N sub-matrices, wherein the first parity check matrix includes non-zero matrices among the M×N sub-matrices included in the second parity check matrix, wherein the non-zero matrices are expressed as an n_c form, n denotes a number of blocks included in the second parity check matrix, and c denotes a number of non-zero matrices included in an $n^{th}$ block column included in the second parity check matrix, and wherein the first parity check matrix includes a preset number of partial matrices, and each of the partial matrices includes a preset number of non-zero sub-matrices on a block column of the second parity check matrix basis.

In accordance with another aspect of the present disclosure, an operating method in a low density parity check (LDPC) decoder is provided. The method includes performing an LDPC decoding operation on an input signal based on a preset first parity check matrix, wherein the first parity check matrix is generated based on a second parity check matrix including M×N sub-matrices, wherein the first parity check matrix includes non-zero matrices among the M×N sub-matrices included in the second parity check matrix, wherein the non-zero matrices are expressed as an n_c form, n denotes a number of blocks included in the second parity check matrix, and c denotes a number of non-zero matrices included in an $n^{th}$ block column included in the second parity check matrix, and wherein the first parity check matrix includes a preset number of partial matrices, and each of the partial matrices includes a preset number of non-zero sub-matrices on a block column of the second parity check matrix basis.

Other aspects, advantages, and salient features of the disclosure will become apparent to those skilled in the art from the following detailed description, which, taken in conjunction with the annexed drawings, discloses exemplary embodiments of the disclosure.

BRIEF DESCRIPTION OF DRAWINGS

The above and other aspects, features and advantages of certain exemplary embodiments of the present disclosure will be more apparent from the following description taken in conjunction with the accompanying drawings, in which.

Throughout the drawings, it should be noted that like reference numbers are used to depict the same or similar elements, features, and structures.

DETAIL DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

Although ordinal numbers such as "first," "second," and so forth will be used to describe various components, those components are not limited herein. The terms are used only for distinguishing one component from another component. For example, a first component may be referred to as a second component and likewise, a second component may also be referred to as a first component, without departing from the teaching of the inventive concept. The term "and/or" used herein includes any and all combinations of one or more of the associated listed items.

The terminology used herein is for the purpose of describing various embodiments only and is not intended to be limiting. As used herein, the singular forms are intended to include the plural forms as well, unless the context clearly indicates otherwise. It will be further understood that the terms "comprises" and/or "has," when used in this specification, specify the presence of a stated feature, number, step, operation, component, element, or combination thereof, but do not preclude the presence or addition of one or more other features, numbers, steps, operations, components, elements, or combinations thereof.

The terms used herein, including technical and scientific terms, have the same meanings as terms that are generally understood by those skilled in the art, as long as the terms are not differently defined. It should be understood that terms defined in a generally-used dictionary have meanings coinciding with those of terms in the related technology.

An embodiment of the present disclosure proposes an apparatus and method for receiving a signal in a communication system supporting a low density parity check (LDPC) code.

An embodiment of the present disclosure proposes a signal receiving apparatus for decoding an LDPC code using a shuffled decoding algorithm and method thereof in a communication system supporting the LDPC code.

An embodiment of the present disclosure proposes an apparatus and method for receiving a signal thereby using low power in a communication system supporting an LDPC code.

An embodiment of the present disclosure proposes an apparatus and method for receiving a signal thereby decreasing the number of memory read/write operations in a communication system supporting an LDPC code.

A method and apparatus proposed in various embodiments of the present disclosure may be applied to various communication systems such as a long term evolution (LTE) system, a long term evolution-advanced (LTE-A) system, a high speed downlink packet access (HSDPA) mobile communication system, a high speed uplink packet access (HSUPA) mobile communication system, a high rate packet Data (HRPD) mobile communication system proposed in a $3^{rd}$ generation project partnership 2 (3GPP2), a wideband code division multiple access (WCDMA) mobile communication system proposed in the 3GPP2, a code division multiple access (CDMA) mobile communication system proposed in the 3GPP2, an Institute of Electrical and Electronics Engineers (IEEE) mobile communication system, an evolved packet system (EPS), a mobile internet protocol (IP) system, and/or the like.

An example of a parity check matrix used in a communication system supporting an LDPC code according to an embodiment of the present disclosure will be described with reference to FIG. 2.

Figure 2:
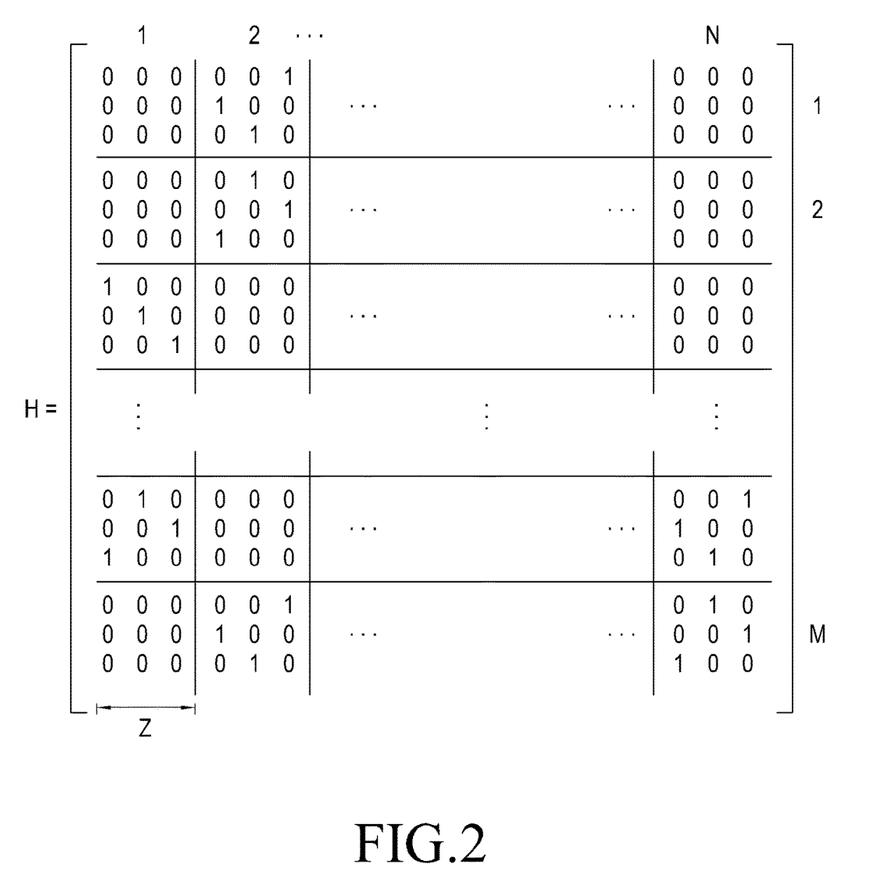
FIG. 2 schematically illustrates an example of a parity check matrix used in a communication system supporting an LDPC code according to an embodiment of the present disclosure.

FIG. 2 schematically illustrates an example of a parity check matrix used in a communication system supporting an LDPC code according to an embodiment of the present disclosure.

Referring to FIG. 2, a parity check matrix H is used for generating an LDPC code or decoding the LDPC code. The LDPC code which is generated using the parity check matrix H may be a regular quasi-cyclic (QC) LDPC code or an irregular QC LDPC code.

Meanwhile, an (N, j, k) LDPC code is a linear block code of which a block length is N, and is defined by a sparse structure of parity check matrix which includes j elements which have a value of 1 in each column, includes k elements which have a value of 1 in each row, and remaining all elements except for the elements which have a value of 1 which have a value of 0.

As described above, the number of weights included in each column included in the parity check matrix is constant as j, and a QC LDPC code that the number of weights of each row included in the parity check matrix is constant as k is the regular QC LDPC code.

Alternatively, a QC LDPC that the number of weights included in each column included in the parity check matrix and the number of weights included in each row included in the parity check matrix are not constant is the irregular QC LDPC.

The parity check matrix H in FIG. 2 is a parity check matrix for an irregular QC LDPC code which includes M block rows and N block columns. The parity check matrix H includes M×N sub-matrices. Here, each sub-matrix is a square matrix which has z×z size, and may be a permutation matrix, a zero matrix, or an identity matrix.

An example of a parity check matrix used in a communication system supporting an LDPC code according to an embodiment of the present disclosure has been described with reference to FIG. 2, and another example of a parity check matrix used in a communication system supporting an LDPC code according to an embodiment of the present disclosure will be described with reference to FIG. 3.

Figure 3:
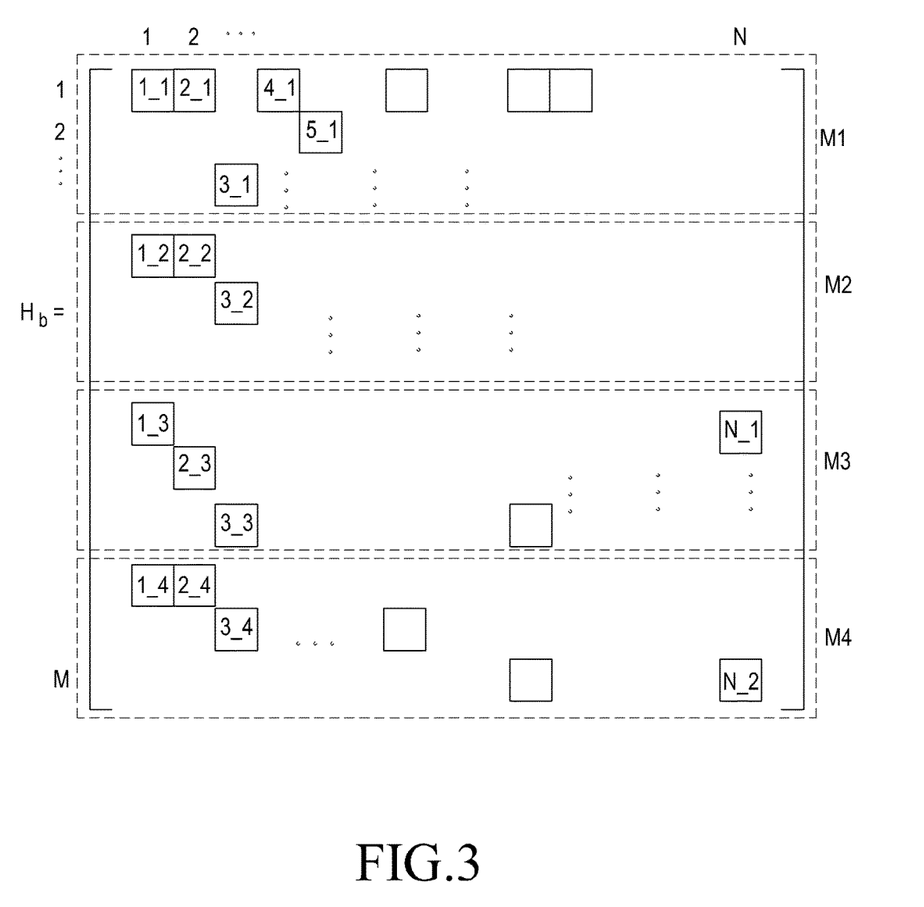
FIG. 3 schematically illustrates another example of a parity check matrix used in a communication system supporting an LDPC code according to an embodiment of the present disclosure.

FIG. 3 schematically illustrates another example of a parity check matrix used in a communication system supporting an LDPC code according to an embodiment of the present disclosure.

Referring to FIG. 3, it will be noted that a parity check matrix in FIG. 3, i.e., a parity check matrix $H_b$ is a parity check matrix in which sub-matrices as non-zero matrices among sub-matrices included in a parity check matrix H in FIG. 3 are expressed as an n_c form. Here, n denotes the number of block columns included in the parity check matrix H in FIG. 2, where n=1, 2, 3, . . . , N. Further, c denotes the number of non-zero matrices included in the $n^{th}$ block column, where c=1, 2, 3, . . . , C. Here, a value of the c may be 0 if there is no non-zero matrix in a related block column, and there may be no sub-matrix which is expressed as n_c if the value of the c is 0.

For example, 1_1 denotes the first non-zero matrix included in the first block column, 1_2 denotes the second non-zero matrix included in the first block column, 1_3 denotes the third non-zero matrix included in the first block column, and 1_4 denotes the fourth non-zero matrix included in the first block column. In this way, the first non-zero matrix included in the $N^{th}$ block column as the last block column is N_1, and the second non-zero matrix included in the $N^{th}$ block column is N_2.

It will be assumed that a parity check matrix $H_b$ in FIG. 3 is classified into four partial matrices, i.e., a partial matrix M1, a partial matrix M2, a partial matrix M3, and a partial matrix M4.

The reason why the parity check matrix $H_b$ is classified into the partial matrix M1, the partial matrix M2, the partial matrix M3, and the partial matrix M4 is for implementing an LDPC decoder which may process data at high-speed and consume low power.

A scheme of classifying the parity check matrix $H_b$ into the four partial matrices will be described below.

Each of the partial matrix M1, the partial matrix M2, the partial matrix M3, and the partial matrix M4 is composed thereby including a preset number of non-zero sub-matrices, e.g., one non-zero sub-matrix on a block column basis. In order for the LDPC decoder to store "messages from a variable node to a check node (variable-to-check messages)", each of the partial matrix M1, the partial matrix M2, the partial matrix M3, and the partial matrix M4 may be implemented with a memory.

A memory structure corresponding to each of a partial matrix M1, a partial matrix M2, a partial matrix M3, and a partial matrix M4 in FIG. 3 will be described with reference to FIG. 4.

Figure 4:
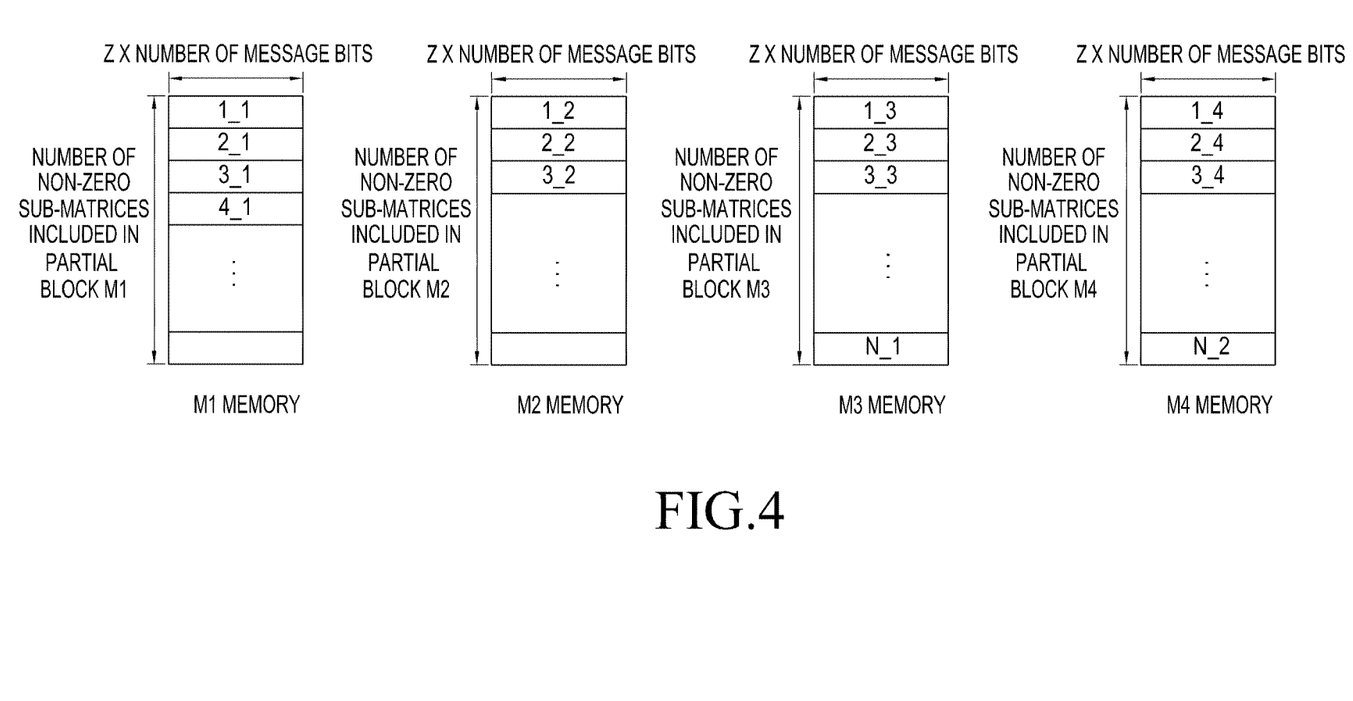
FIG. 4 schematically illustrates a memory structure corresponding to each of a partial matrix M1, a partial matrix M2, a partial matrix M3, and a partial matrix M4 in FIG. 3.

FIG. 4 schematically illustrates a memory structure corresponding to each of a partial matrix M1, a partial matrix M2, a partial matrix M3, and a partial matrix M4 in FIG. 3.

Referring to FIG. 4, a memory corresponding to the partial matrix M1 is an M1 memory, a memory corresponding to the partial matrix M2 is an M2 memory, a memory corresponding to the partial matrix M3 is an M3 memory, and a memory corresponding to the partial matrix M4 is an M4 memory. That is, the M1 memory is a memory for storing variable-to-check messages for the partial matrix M1, the M2 memory is a memory for storing variable-to-check messages for the partial matrix M2, the M3 memory is a memory for storing variable-to-check messages for the partial matrix M3, and the M4 memory is a memory for storing variable-to-check messages for the partial matrix M4.

The number of regions included in each of the M1 memory, the M2 memory, the M3 memory, and the M4 memory is identical to the number of non-zero sub matrices included in a partial matrix corresponding to each of the M1 memory, the M2 memory, the M3 memory, and the M4 memory, and each of regions included in each of the M1 memory, the M2 memory, the M3 memory, and the M4 memory has a size corresponding to z×the number of message bits.

As described above, the reason why the M1 memory, the M2 memory, the M3 memory, and the M4 memory are implemented is for implementing the LDPC decoder as a low power LDPC decoder by minimizing the number of memories included in the LDPC decoder to decrease the number of memory read/write operations and implementing an LDPC decoder structure which is optimized for a parity check matrix concurrently or substantially concurrently.

Meanwhile, the memory structure in FIG. 4 is based on a parity check matrix $H_b$ in FIG. 3. In a parity check matrix of a general LDPC code, since the number of non-zero elements in included in each column is less than the number of non-zero elements in included in each row, there is a need for a memory structure in FIG. 4, and this will be described below.

In order to read/write a message corresponding to each of non-zero matrices 1_1, 1_2, 1_3, and 1_4 in FIG. 3, the LDPC decoder updates messages corresponding to the non-zero matrices 1_1, 1_2, 1_3, and 1_4 concurrently or substantially concurrently using locations corresponding to the non-zero matrices 1_1, 1_2, 1_3, and 1_4 in the memories in FIG. 4, i.e., the M1 memory, the M2 memory, the M3 memory, and the M4 memory.

As described above, the LDPC decoder may perform a message update operation using a memory address of each of the M1 memory, the M2 memory, the M3 memory, and the M4 memory for all messages not 0 in the parity check matrix $H_b$.

As such, an embodiment of the present disclosure proposes an LDPC decoder for increasing data throughput and decreasing the number of memory read/write operations using a parity check matrix $H_b$ in FIGS. 3 and 4, a memory mapping scheme according to the parity check matrix $H_b$, and a shuffled decoding algorithm, and method thereof, and this will be described below.

An operating process of an LDPC decoder in a signal receiving apparatus in a communication system according to an embodiment of the present disclosure will be described with reference to FIG. 5.

Figure 5:
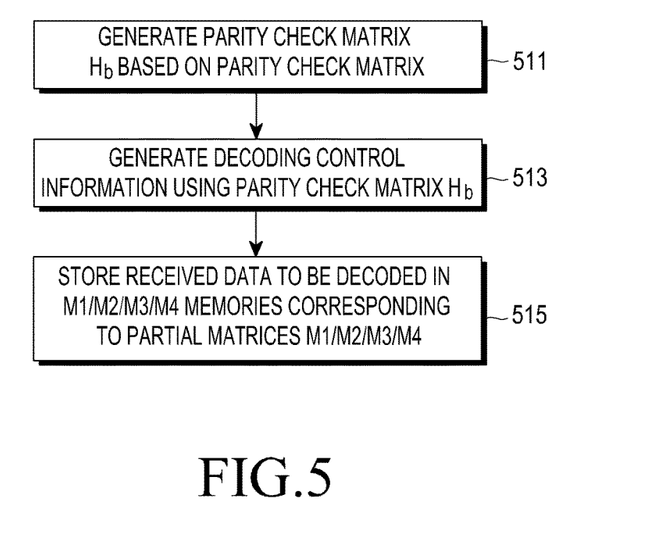
FIG. 5 schematically illustrates an operating process of an LDPC decoder in a signal receiving apparatus in a communication system according to an embodiment of the present disclosure.

FIG. 5 schematically illustrates an operating process of an LDPC decoder in a signal receiving apparatus in a communication system according to an embodiment of the present disclosure.

Referring to FIG. 5, the LDPC decoder generates a parity check matrix $H_b$ by expressing non-zero matrices among sub-matrices included in a parity check matrix H as an n_c form, and dividing the parity check matrix H of which non-zero matrices are expressed as the n_c form into four partial matrices at operation 511.

The LDPC decoder generates decoding control information using the generated parity check matrix $H_b$ at operation 513. The decoding control information may be acquired by performing a variable-to-check message update operation in FIG. 4, and the detailed description will be omitted herein.

The LDPC decoder stores received data to be decoded in an M1 memory, an M2 memory, an M3 memory, and an M4 memory corresponding to partial matrices M1, M2, M3, and M4 included in the parity check matrix $H_b$ using the generated decoding control information at operation 515.

In FIG. 5, the LDPC decoder directly performs an operation of generating the parity check matrix $H_b$ based on the parity check matrix H. However, it will be understood by those of ordinary skill in the art that the LDPC decoder may perform an LDPC decoding operation using a preset parity check matrix $H_b$.

Although FIG. 5 illustrates an operating process of an LDPC decoder in a signal receiving apparatus in a communication system according to an embodiment of the present disclosure, various changes could be made to FIG. 5. For example, although shown as a series of operations, various operations in FIG. 5 could overlap, occur in parallel, occur in a different order, or occur multiple times.

An operating process of an LDPC decoder in a signal receiving apparatus in a communication system according to an embodiment of the present disclosure has been described with reference to FIG. 5, and a process of performing a message update operation using a shuffled decoding algorithm in an LDPC decoder in a signal receiving apparatus in a conventional communication system will be described with reference to FIG. 6.

Figure 6:
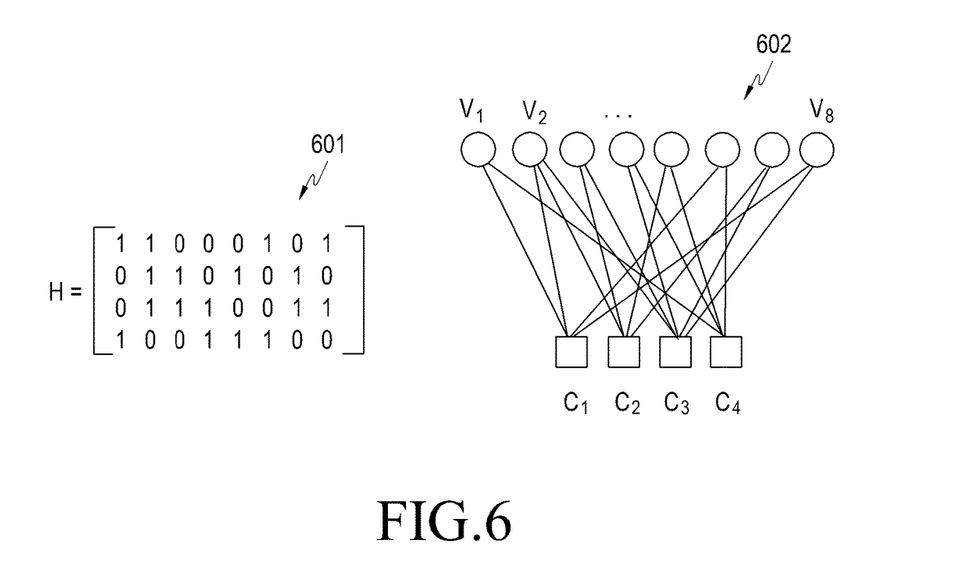
FIG. 6 schematically illustrates a process of performing a message update operation using a shuffled decoding algorithm in an LDPC decoder in a signal receiving apparatus in a conventional communication system.

FIG. 6 schematically illustrates a process of performing a message update operation using a shuffled decoding algorithm in an LDPC decoder in a signal receiving apparatus in a conventional communication system.

Referring to FIG. 6, a reference sign indicates a parity check matrix H 601 of which a code length is 8, and a code rate is 1/2 (code length=8, code rate=1/2). A reference sign indicates a bipartite graph 602 corresponding to the parity check matrix H.

The bipartite graph 602 is generated by configuring a part corresponding to rows included in the parity check matrix H 601 as check nodes $C_1$, $C_2$, $C_3$, and $C_4$, configuring a part corresponding to columns included in the parity check matrix H 601 as variable nodes $V_1$, $V_2$, ..., and $V_8$, and configuring a part corresponding to elements which have a value of 1 (non-zero) among elements included in the parity check matrix H 601 as an edge which connects a check node and a variable node.

In the bipartite graph 602, $C_m$ denotes a check node, where m=1, 2, 3, 4. Here, m denotes a location of rows included in the parity check matrix H 601. In the bipartite graph 602, $V_n$ denotes a variable node, where n=1, 2, ..., 8. Here, n denotes a location of columns included in the parity check matrix H 601.

In the bipartite graph 602, $R_{mn}$ denotes a message which is transferred from the check node $C_m$ to the variable node V. For example, messages which are transferred from a check node $C_1$ to each of four variable nodes $V_1$, $V_2$, $V_6$, and $V_8$ are expressed as $R_{11}$, $R_{12}$, $R_{16}$, and $R_{18}$. That is, the $R_{mn}$ denotes an output message of the check node $C_m$ which is transferred to the variable node $V_n$. In the bipartite graph 602, $Q_{mn}$ denotes an output message of the variable node $V_n$ which is transferred to the check node $C_m$.

If a set of variable nodes which are connected to the check node $C_m$ is N(m), the N(m) may be expressed as N(m)={n: $H_{mn}$=1}. For example, a set of variable nodes which are connected to a check node $C_1$ included in the bipartite graph 602 N(m=1) may be expressed as N(m=1)={1, 2, 6, 8}.

If a set of check nodes which are connected to the variable node $V_n$ is M(n), the M(n) may be expressed as M(n)={m: $H_{mn}$=1}. For example, a set of check nodes which are connected to a variable node $V_1$ included in the bipartite graph 602 M(n=1) may be expressed as M(n=1)={1, 4}.

An initial operation of a shuffled decoding update operation which is performed in the LDPC decoder may be expressed as $R_{mn}$=0, $Q_{mn}$, =$L_n$. Here, $L_n$ is an input for the LDPC decoder and an input message for the variable node $V_n$, and is expressed as Log-Likelihood Ratio (LLR) values.

As such, in a condition, $1 \le n \le N$, $m \in M(n)$, a $R_{mn}$ message and a $Q_{mn}$ message may be expressed as EQNS. (1) through (4).

$$T_{mn}^i = \prod_{\substack{n' \in N(m) \setminus n \\ n' < n}} \tanh\left(\frac{Q_{mn'}^i}{2}\right) \prod_{\substack{n' \in N(m) \setminus n \\ n' > n}} \tanh\left(\frac{Q_{mn'}^{i-1}}{2}\right) \quad \text{EQN. (1)}$$

$$R_{mn}^i = \log\frac{1+T_{mn}^i}{1-T_{mn}^i} \quad \text{EQN. (2)}$$

$$Q_{mn}^i = L_n + \Sigma_{m' \in M(n) \setminus m} R_{m'n}^i \quad \text{EQN. (3)}$$

$$Q_n^i = L_n + \Sigma_{m' \in M(n)} R_{m'n}^i \quad \text{EQN. (4)}$$

In EQNS. (1) through (4), a variable i denotes a current message update process, a variable i-1 denotes a message update process before the current message update process.

In EQN. (1), $T_{mn}^i$ denotes an intermediate calculation for calculating a message which is transferred from the check node $C_m$ to the variable node $V_n$ in the current message update process, i.e., a message update process #i.

In EQN. (2), in a case that the $T_{mn}^i$ which is calculated in EQN. (1) is input, output messages which are transferred from the check node $C_m$ to the variable node $V_n$ in the message update process #i are expressed as $R_{mn}^i$. That is, $R_{mn}^i$ denotes output messages corresponding to the check node $C_m$ in the current message update process, i.e., the message update process #i.

In EQN. (3), $Q_{mn}^i$ denotes a message which is transferred from the variable node $V_n$ to the check node $C_m$ in the message update process #i. That is, the $Q_{mn}^i$ denotes output messages corresponding to the variable node $V_n$ in the message update process #i.

In EQN. (4), in the message update process #i, $Q_n^i$ is a hard decision value corresponding to the variable node $V_n$ and is equal to a decoded value. That is, $Q_n^i$ denotes a decoded output message corresponding to the variable node $V_n$ in the message update process #i.

EQNS. (1) and (2) denote one of Belief Propagation (BP) algorithms of which a hardware complexity is high, and may substitute for a min-sum decoding algorithm, a normalized min-sum decoding algorithm, and an offset min-sum decoding algorithm of which a hardware complexity is low.

A process of performing a message update operation using a shuffled decoding algorithm in an LDPC decoder in a signal receiving apparatus in a conventional communication system has been described with reference to FIG. 6, and a process of performing a message update operation using a shuffled decoding algorithm in an LDPC decoder in a signal receiving apparatus in a communication system according to an embodiment of the present disclosure will be described with reference to FIG. 7.

Figure 7:
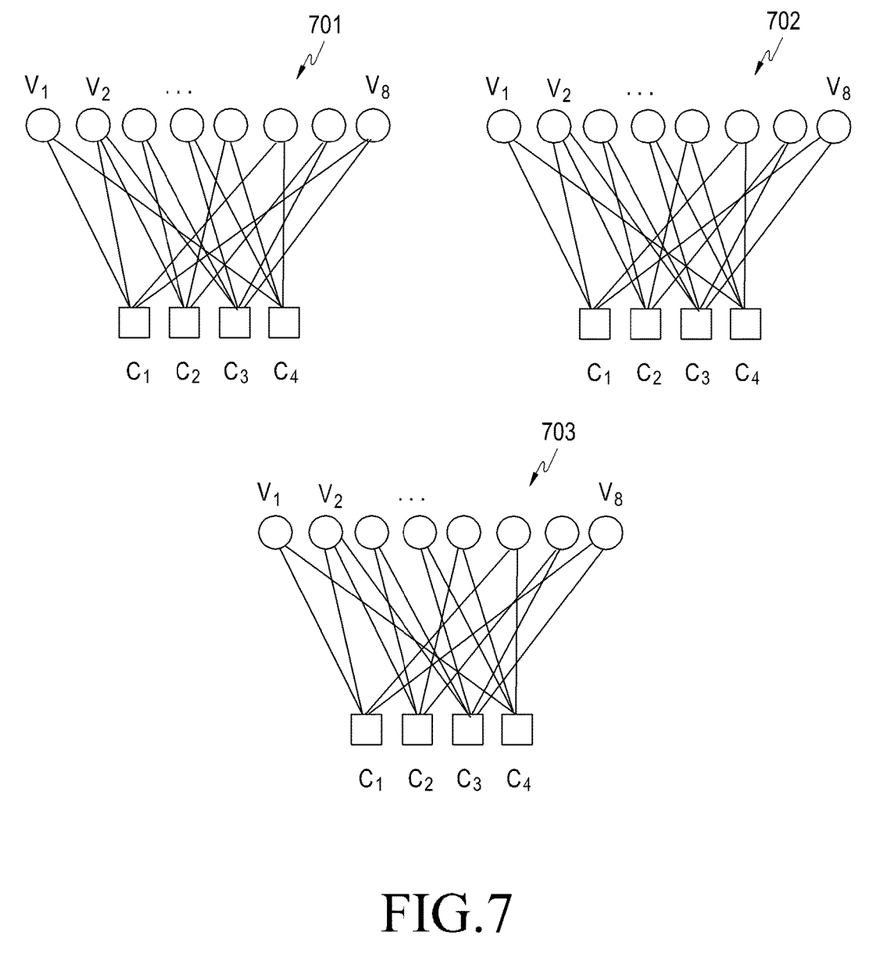
FIG. 7 schematically illustrates a process of performing a message update operation using a shuffled decoding algorithm in an LDPC decoder in a signal receiving apparatus in a communication system according to an embodiment of the present disclosure.

FIG. 7 schematically illustrates a process of performing a message update operation using a shuffled decoding algorithm in an LDPC decoder in a signal receiving apparatus in a communication system according to an embodiment of the present disclosure.

Referring to FIG. 7, a reference sign indicates a bipartite graph 701 which uses updated $R_{11}$ and $R_{41}$ messages for updating a message of a variable node $V_1$. Here, the $R_{11}$, $R_{41}$ performs a message update operation using input values ($Q_{12}$, $Q_{16}$, $Q_{18}$), ($Q_{44}$, $Q_{45}$, $Q_{46}$), respectively. As described above, in the bipartite graph 701, check nodes {($C_1$, $C_4$), ($C_1$, $C_2$, $C_3$), ($C_2$, $C_3$), ..., ($C_1$, $C_3$)} which are connected to specific variable nodes {$V_1$, $V_2$, $V_3$, ... $V_8$} are detected, and an output message of the specific variable nodes {$V_1$, $V_2$, $V_3$, ... $V_8$} is updated concurrently or substantially concurrently.

A reference sign indicates a bipartite graph 702 which indicates $R_{mn}$ output messages which are necessary for updating a variable node V2.

A reference sign indicates a bipartite graph 703 which indicates an operation of updating a variable node $V_8$.

As a result, an output message update process for all variable nodes is performed through a process of updating an output message of the variable node $V_8$ such as the bipartite graph 703.

A shuffled decoding update operation proposed in an embodiment of the present disclosure may be implemented using min-sum series of decoding algorithms of which a hardware complexity is low, i.e., a min-sum decoding algorithm, a normalized min-sum decoding algorithm, an offset min-sum decoding algorithm, and this will be described below.

Firstly, an output message $Q_{mn}$ of each variable node is updated as $Q_{mn}=L_n$ corresponding to an input message $L_n$, 1≤n≤N, of an LDPC decoder. For all check nodes $C_m$, 1≤n≤N, output messages are updated as ($min1^{st}$, $min2^{nd}$, $1^{st}\_loc$, $2^{nd}\_loc$). Here, min1st denotes a minimum value among input messages of the check node $C_m$, $min2^{nd}$ denotes a minimum value among input messages of the check node $C_m$ except for $min1^{st}$, $1^{st}\_loc$ denotes location information of an input message corresponding to the minist among input messages of the check node $C_m$, and $2^{nd}$ loc denotes location information of an input message corresponding to the $min2^{nd}$ among input messages of the check node $C_m$.

A process of performing a message update operation using a shuffled decoding algorithm in an LDPC decoder in a signal receiving apparatus in a communication system according to an embodiment of the present disclosure has been described with reference to FIG. 7, and a process of performing a message update operation using a shuffled decoding algorithm in an LDPC decoder in a signal receiving apparatus in a communication system using a parity check matrix H in FIG. 6 according to an embodiment of the present disclosure will be described with reference to FIG. 8.

Figure 8:
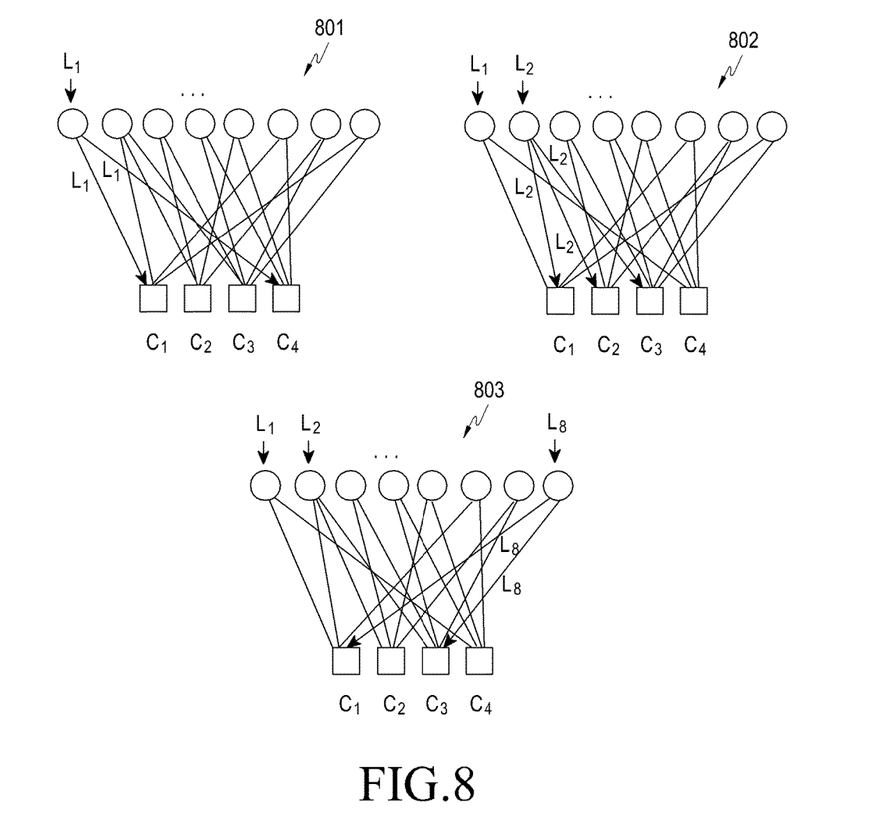
FIG. 8 schematically illustrates a process of performing a message update operation using a shuffled decoding algorithm in an LDPC decoder in a signal receiving apparatus in a communication system using a parity check matrix H in FIG. 6 according to an embodiment of the present disclosure.

FIG. 8 schematically illustrates a process of performing a message update operation using a shuffled decoding algorithm in an LDPC decoder in a signal receiving apparatus in a communication system using a parity check matrix H in FIG. 6 according to an embodiment of the present disclosure.

Referring to FIG. 8, a reference sign indicates a bipartite graph 801 indicating a process of inputting a variable node output message L1 to update check nodes $C_1$ and $C_4$.

A reference sign indicates a bipartite graph 802 indicating a process of inputting a variable node output message $L_2$ to update check nodes $C_1$, $C_2$, and $C_3$.

A reference sign indicates a bipartite graph 803 indicating a check node update process corresponding to all variable nodes $V_1$~$V_8$. That is, in the bipartite graph 803, an LDPC decoder inputs variable node output messages $L_1, L_2, \ldots, L_8$ to update output messages of all check nodes $C_1, C_2, C_3$, and $C_4$, i.e., $C_1$=($min1^{st}$, $min2^{nd}$, $1^{st}\_loc$, $2^{nd}\_loc$), $C_2$=($min1^{st}$, $min2^{nd}$, $1^{st}\_loc$, $2^{nd}\_loC$), $C_3$=($min1^{st}$, $min2^{nd}$, $1^{st}\_loc$, $2^{nd}\_loc$), $C_4$=($min1^{st}$, $min2^{nd}$, $1^{st}\_loc$, $2^{nd}\_loc$).

In summary, $C_m$=($min1^{st}$, $min2^{nd}$, $1^{st}\_loc$, $2^{nd}\_loc$) values as an output message a check node $C_m$ corresponding to 1≤m≤M are identical to a check node output message $R_{mn}$=$C_m$, n∈M(n) which is transferred from a check node $C_m$, m∈M(n) to a variable node $V_n$.

Meanwhile, a variable node output message $Q_{mn}$ which is transferred from a $V_n$, 1≤n≤N to a check node may be expressed as EQNS. (5) and (6).

$$Q_{mn}=\Sigma_{m'\in M(n)}R_{m'n}-R_{mn}+L_n=\Sigma_{m'\in M(n)}C_{m'}-C_m+L_n \quad \text{EQN. (5)}$$

$$Q_n=\Sigma_{m'\in M(n)}C_{m'}+L_n \quad \text{EQN. (6)}$$

In EQN. (5), a variable node output message which is lastly updated $Q_{mn}$ is used as an input value for updating a check node output message corresponding to a variable node $V_n$, m'∈M(n) $C_{m'}$=($min1^{st}$, $min2^{nd}$, $1^{st}\_loc$, $2^{nd}\_loc$)

EQN. (6) denotes a decoded output message for the $n^{th}$ node corresponding to a variable node $V_n$.

Figure 9:
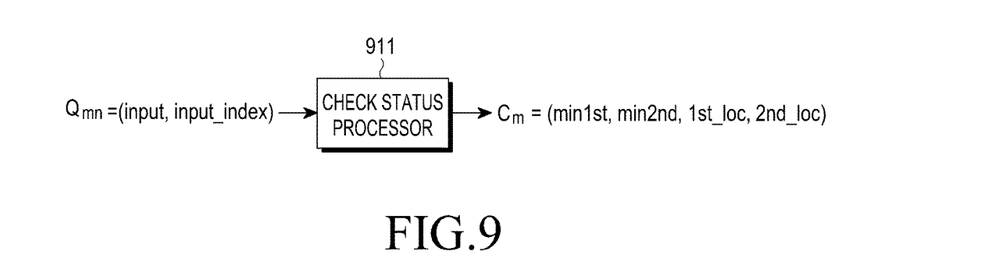
FIG. 9 schematically illustrates an operating process of a check status processor included in an LDPC decoder in a signal receiving apparatus in a communication system according to an embodiment of the present disclosure.

A process of performing a message update operation using a shuffled decoding algorithm in an LDPC decoder in a signal receiving apparatus in a communication system using a parity check matrix H in FIG. 6 according to an embodiment of the present disclosure has been descried with reference to FIG. 8, and an operating process of a check status processor included in an LDPC decoder in a signal receiving apparatus in a communication system according to an embodiment of the present disclosure will be descried with reference to FIG. 9.

FIG. 9 schematically illustrates an operating process of a check status processor included in an LDPC decoder in a signal receiving apparatus in a communication system according to an embodiment of the present disclosure.

Referring to FIG. 9, a check status processor 911 updates a check node output message $C_m$ using a variable node output message $Q_{mn}$.

An LDPC decoder proposed in the present disclosure is a low power decoder, and uses a shuffled decoding algorithm proposed in the present disclosure. In the shuffled decoding algorithm, the check status processor 911 updates a variable node output message $Q_{mn}$ which is updated before a current message update process and variable node output messages $Q_{mn}$ which are lastly updated using registers or one memory bank in order to update a check node output message $R_{mn}(=C_m)$.

As such, the check status processor 911 may be applied to a scheme of updating ($min1^{st}$, $min2^{nd}$, $1^{st}\_loc$, $2^{nd}\_loc$)= (first minimum, second minimum, first minimum location, second minimum location) information in a general min-sum decoding algorithm, a normalized min-sum decoding algorithm, an offset min-sum decoding algorithm, and the like.

An operating process of a check status processor included in an LDPC decoder in a signal receiving apparatus in a communication system according to an embodiment of the present disclosure has been described with reference to FIG. 9, and an operating process of an LDPC decoder in a signal receiving apparatus in a communication system according to an embodiment of the present disclosure will be described with reference to FIG. 10.

Figure 10:
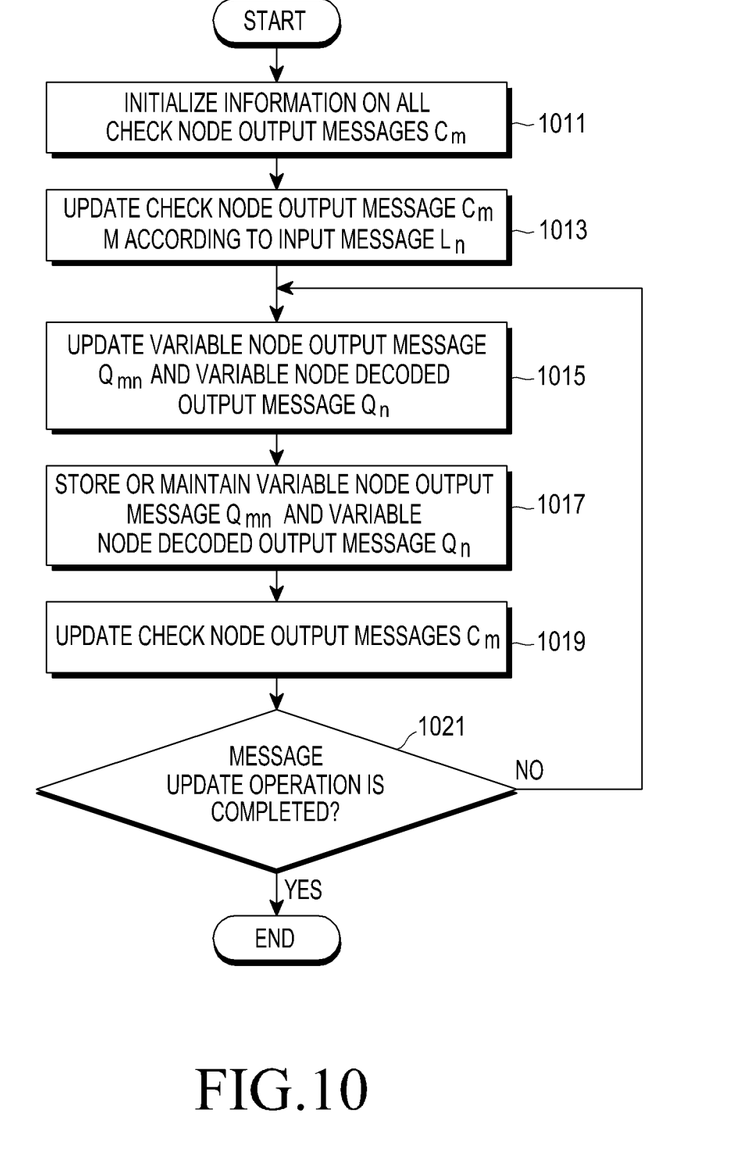
FIG. 10 schematically illustrates an operating process of an LDPC decoder in a signal receiving apparatus in a communication system according to an embodiment of the present disclosure.

FIG. 10 schematically illustrates an operating process of an LDPC decoder in a signal receiving apparatus in a communication system according to an embodiment of the present disclosure.

Referring to FIG. 10, an LDPC decoder initializes information on all check node output messages $C_m$=($min1^{st}$, $min2^{nd}$, $1^{st}\_loc$, $2^{nd}\_loc$), 1≤m≤M at operation 1011. The LDPC decoder updates a check node output message $C_m$, m∈M(n) according to an input message of the LDPC decoder $L_n$, 1≤n≤N at operation 1013.

The LDPC decoder inputs a check node output message $C_m$ to update a variable node output message $Q_{mn}$ and a variable node decoded output message $Q_n$ using EQNS. (5)

and (6) at operation 1015. The LDPC decoder temporarily stores or maintains the updated variable node output messages $Q_{mn}$ and $Q_n$ at operation 1017. The LDPC decoder updates a check node output message $C_m$ using the updated variable node output messages $Q_{mn}$ and $Q_n$ at operation 1019. The LDPC decoder determines whether a message update operation is completed for all columns included in a parity check matrix H which is used in the communication system at operation 1021.

If the message update operation is not completed for all columns included in the parity check matrix H, the LDPC decoder returns at operation 1015.

In FIG. 10, the LDPC decoder stores or maintains the updated variable node output messages $Q_{mn}$ and $Q_n$, and updates the check node output message $C_m$ using the updated variable node output messages $Q_{mn}$, and $Q_n$. However, it will be understood by those of ordinary skill in the art that the LDPC decoder may temporarily store or maintain the updated variable node output messages $Q_{mn}$ and $Q_n$ after updating the check node output message $C_m$ using the updated variable node output messages $Q_{mn}$ and $Q_n$, or the LDPC decoder temporarily stores or maintains the updated variable node output messages $Q_{mn}$ and $Q_n$ and updates the check node output message $C_m$ using the updated variable node output messages $Q_{mn}$ and $Q_n$ concurrently or substantially concurrently.

Although FIG. 10 illustrates an operating process of an LDPC decoder in a signal receiving apparatus in a communication system according to an embodiment of the present disclosure, various changes could be made to FIG. 10. For example, although shown as a series of operations, various operations in FIG. 10 could overlap, occur in parallel, occur in a different order, or occur multiple times.

An operating process of an LDPC decoder in a signal receiving apparatus in a communication system according to an embodiment of the present disclosure has been described with reference to FIG. 10, and an inner structure of a signal receiving apparatus in a communication system according to an embodiment of the present disclosure will be described with reference to FIG. 11.

Figure 11:
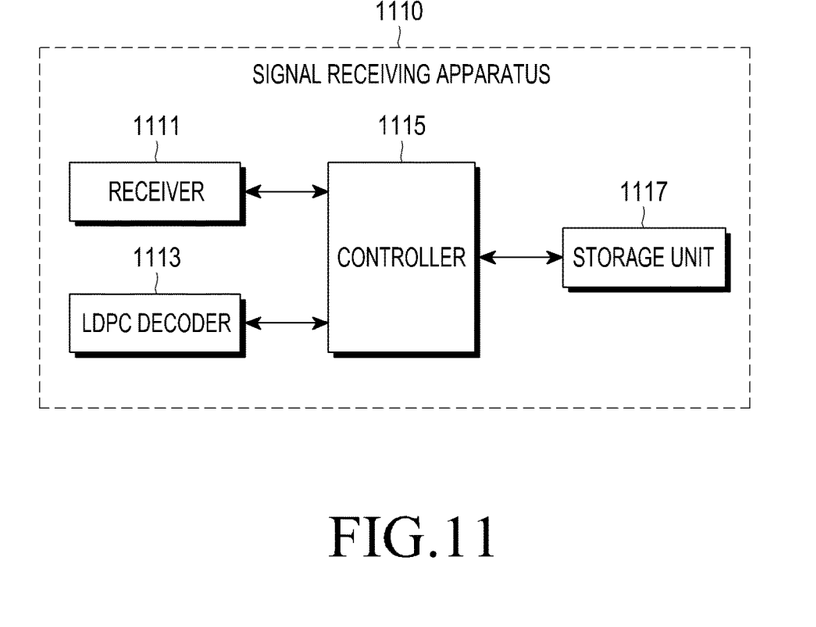
FIG. 11 schematically illustrates an inner structure of a signal receiving apparatus in a communication system according to an embodiment of the present disclosure.

FIG. 11 schematically illustrates an inner structure of a signal receiving apparatus in a communication system according to an embodiment of the present disclosure.

Referring to FIG. 11, a signal receiving apparatus 1100 includes a receiver 1111, an LDPC decoder 1113, a controller 1115, and a storage unit 1117.

The controller 1115 controls the overall operation of the signal receiving apparatus 1100. More particularly, the controller 1115 controls the signal receiving apparatus 1100 to perform an operation related to an operation of performing an LDPC decoding operation. The operation related to the operation of performing the LDPC decoding operation is performed in the manner described with reference to FIGS. 2 to 5 and FIGS. 7 to 10 and a description thereof will be omitted herein.

The receiver 1111 receives various signals from a signal transmitting apparatus under a control of the controller 1115, and performs a signal receiving process operation on the received signal corresponding to a preset signal receiving process scheme.

The LDPC decoder 1113 performs an LDPC decoding operation on a signal which is output from the receiver 1111 corresponding to a preset LDPC decoding scheme under a control of the controller 1115. The LDPC decoding operation is performed in the manner described with reference to FIGS. 2 to 5 and FIGS. 7 to 10 and a description thereof will be omitted herein.

The storage unit 1117 stores a program related to performing the LDPC decoding operation in the signal receiving apparatus 1100, various data, and the like. The storage unit 1117 stores the various signals which the receiver 1111 receives from the signal transmitting apparatus.

While the receiver 1111, the LDPC decoder 1113, the controller 1115, and the storage unit 1117 are described as separate units, it is to be understood that this is merely for convenience of description. In other words, two or more of the receiver 1111, the LDPC decoder 1113, the controller 1115, and the storage unit 1117 may be incorporated into a single unit.

As is apparent from the foregoing description, an embodiment of the present disclosure enables to receive a signal thereby decoding an LDPC code using a shuffled decoding algorithm in a communication system supporting the LDPC code.

An embodiment of the present disclosure enables to receive a signal thereby using low power in a communication system supporting an LDPC code.

An embodiment of the present disclosure enables to receive a signal thereby decreasing the number of memory read/write operations in a communication system supporting an LDPC code.

Certain aspects of the present disclosure may also be embodied as computer readable code on a computer readable recording medium. A computer readable recording medium is any data storage device that can store data, which can be thereafter read by a computer system. Examples of the computer readable recording medium include Read-Only Memory (ROM), Random-Access Memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion. As such, functional programs, code, and code segments for accomplishing the present disclosure can be easily construed by programmers skilled in the art to which the present disclosure pertains.

It can be appreciated that a method and apparatus according to an embodiment of the present disclosure may be implemented by hardware, software and/or a combination thereof. The software may be stored in a non-volatile storage, for example, an erasable or re-writable Read Only Memory (ROM), a memory, for example, a Random Access Memory (RAM, a memory chip, a memory device, or a memory Integrated Circuit (IC), or an optically or magnetically recordable non-transitory machine-readable, e.g., computer-readable, storage medium, e.g., a Compact Disk (CD), a Digital Versatile Disk (DVD), a magnetic disk, or a magnetic tape. A method and apparatus according to an embodiment of the present disclosure may be implemented by a computer or a mobile terminal that includes a controller and a memory, and the memory may be an example of a non-transitory machine-readable, e.g., computer-readable, storage medium suitable to store a program or programs including instructions for implementing various embodiments of the present disclosure.

The present disclosure may include a program including code for implementing the apparatus and method as defined by the appended claims, and a non-transitory machine-readable, e.g., computer-readable, storage medium storing the program. The program may be electronically transferred via any media, such as communication signals, which are transmitted through wired and/or wireless connections, and the present disclosure may include their equivalents.

An apparatus according to an embodiment of the present disclosure may receive the program from a program providing device which is connected to the apparatus via a wire or a wireless and store the program. The program providing device may include a memory for storing instructions which instruct to perform a contents protect method which has been already installed, information necessary for the contents protect method, and the like, a communication unit for performing a wired or a wireless communication with a graphic processing device, and a controller for transmitting a related program to a transmitting/receiving device based on a request of the graphic processing device or automatically transmitting the related program to the transmitting/receiving device.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method for reducing memory access when receiving a signal by a physical electronic signal receiving apparatus in a communication system supporting a low density parity check (LDPC) code, the physical electronic signal receiving apparatus including a receiver, a processor, a low power LDPC decoder, and a plurality of non-transitory computer readable recordable memories, the processor being configured to control the receiver, the low power LDPC decoder and the plurality of non-transitory computer readable recordable memories, the method comprising:
   receiving, via the receiver, a signal; and
   performing, via the low power LDPC decoder, an LDPC decoding operation for the received signal,
   wherein performing, via the low power LDPC decoder, the LDPC decoding operation comprises:
      detecting, via the low power LDPC decoder, non-zero matrices among M x N sub-matrices included in a first parity check matrix;
      generating, via the low power LDPC decoder, a second parity check matrix including the non-zero matrices;
      grouping, via the low power LDPC decoder, the non-zero matrices into a plurality of groups, each of the plurality of groups including a preset number of non-zero matrices included in each block column of the first parity check matrix;
      storing, via the low power LDPC decoder, the plurality of groups to the plurality of non-transitory computer readable recordable memories in the physical electronic signal receiving apparatus, respectively, a number of regions included in each of the plurality of non-transitory computer readable recordable memories being equal to a number of non-zero matrices included in a corresponding group of the plurality of groups;
      updating, via the low power LDPC decoder, check node to variable node messages (check-to-variable messages) corresponding to at least one nonzero matrix having a same block column stored in each of the plurality of non-transitory computer readable recordable memories; and
      simultaneously updating, via the low power LDPC decoder, variable node to check node messages (variable-to-check messages) using the updated check-to-variable messages.

2. The method of claim 1, wherein each of the regions has a size which is based on a size of a non-zero matrix and a number of message bits.

3. The method of claim 1, wherein a check-to-variable message included in the check-to-variable messages is transferred from a specific check node to a variable node,
   wherein the specific check node is $C_m (1 \leq m \leq M)$,
   wherein the variable node is $V_n (1 \leq n \leq N)$,
   wherein the check-to-variable message is $C_m$ =(min1st, min2nd, 1st_loc, 2nd_loc), the min1st denoting a minimum value among input messages of the specific check node, the min2nd denoting a minimum value among input messages of the specific check node except for the min1st, the $1st_{13}$ loc denoting location information of an input message corresponding to the min1st among input messages of the specific check node, and the 2nd_loc denoting location information of an input message corresponding to the min2nd among the input messages of the specific check node, and
   wherein the check-to-variable message is $R_{mn} = C_m$, $n \in N(n)$.

4. The method of claim 1, wherein a variable-to-check message $Q_{mn}$ included in the variable-to-check messages transferred from a variable node $V_n (1 \leq n \leq N)$ to a check node $C_m (1 \leq m \leq M)$ is expressed as:

$$Q_{mn} = \Sigma_{m' \in M(n)} R_{m'n} - R_{mn} + L_n = \Sigma_{m' \in M(n)} C_{m'} - C_m + L_n$$

where the variable-to-check message $Q_{mn}$ denotes the variable-to-check message which is lastly updated, the variable-to-check message $Q_{mn}$ which is lastly updated is used as an input value for updating a check-to-variable message $C_m$ =(min1st, min2nd, 1st—loc, 2nd_loc) corresponding to the variable node $V_n (m \in M(n))$, the min1 st denoting a minimum value among input messages of a specific check node, the min2nd denoting a minimum value among input messages of the specific check node except for the min1st, the 1st_loc denoting location information of an input message corresponding to the min1st among input messages of the specific check node, and the 2nd_loc denoting location information of an input message corresponding to the min2nd among the input messages of the specific check node, and $L_n$ denotes an input message for the variable node $V_n$.

5. The method of claim 1, wherein a decoded output message corresponding to a variable node $V_n (1 \leq n \leq N)$ is expressed as:

$$Q_n = \Sigma_{m' \in M(n)} C_{m'} + L_n$$

where $Q_n$ denotes a decoded output message for an $n^{th}$ node corresponding to the variable node $V_n$, $L_n$ denotes an input message for the variable node $V_n$, and $C_m$ denotes a check node $C_m (1 \leq m \leq M)$.

6. The method of claim 1, wherein the LDPC code is one of a regular quasi-cyclic (QC) LPDC code and an irregular QC LDPC code.

7. A physical electronic signal receiving apparatus in a communication system supporting a low density parity check (LDPC) code for reducing memory access, the physical electronic signal receiving apparatus comprising:
   a plurality of non-transitory computer readable recordable memories;
   a receiver configured to receive a signal;
   a low power LDPC decoder configured to an LDPC decoding operation for the received signal,
   wherein the low power LDPC decoder is further configured to:

detect non-zero matrices among sub-matrices included in a first parity check matrix;

generate a second parity check matrix including the non-zero matrices;

group the non-zero matrices into a plurality of groups, each of the plurality of groups including a preset number of non-zero matrices included in each block column of the first parity check matrix;

store the plurality of groups to the plurality of non-transitory computer readable recordable memories, respectively, a number of regions included in each of the plurality of non-transitory computer readable recordable memories being equal to a number of non-zero matrices included in a corresponding group of the plurality of groups;

update check node to variable node messages (check-to-variable messages) corresponding to at least one non-zero matrix having a same block column stored in each of the plurality of non-transitory computer readable recordable memories; and simultaneously update variable node to check node messages (variable-to-check messages) using the updated check-to-variable messages; and a processor configured to control the plurality of non-transitory computer readable recordable memories, the receiver and the low power LDPC decoder.

8. The physical electronic signal receiving apparatus of claim 7, wherein each of the regions has a size which is proportional to a size of a non-zero matrix and a number of message bits.

9. The physical electronic signal receiving apparatus of claim 7, wherein a check node output message included in the check-to-variable messages is transferred from a specific check node to a variable node, wherein the specific check node is $C_m(1 \leq m \leq M)$, wherein the variable node is $V_n(1 \leq n \leq N)$, wherein the check-to-variable message is $C_m$ =(min1st, min2nd, 1st_loc, 2nd_loc), the min1st denoting a minimum value among input messages of the specific check node, the min2nd denoting a minimum value among input messages of the specific check node except for the min1st, the 1st_loc denoting location information of an input message corresponding to the min1st among input messages of the specific check node, and the 2nd_loc denoting location information of an input message corresponding to the min2nd among the input messages of the specific check node, and wherein the check-to-variable message is $R_{mn}=C_m$, $n \in N(m)$.

10. The physical electronic signal receiving apparatus of claim 7, wherein a variable-to-check message $_{mn}$ included in the variable-to-check messages is transferred from the variable node $v_n(1 \leq n \leq N)$ to a check node $C_m(1 \leq m \leq M)$ is expressed as:

$$Q_{mn}=\Sigma_{m' \in M(n)}R_{m'n}-R_{mn}+L_n=\Sigma_{m' \in M(n)}C_m-C_m+L_n$$

where the variable-to-check message $Q_{mn}$ denotes the variable-to-check message which is lastly updated, the variable-to-check message $Q_{mn}$ which is lastly updated is used as an input value for updating a check-to-variable message $C_m$ =(min1st, min2nd, 1st_loc, 2nd_loc) corresponding to the variable node $v_n(m \in M(n))$, the min1st denoting a minimum value among input messages of a specific check node, the min2nd denoting a minimum value among input messages of the specific check node except for the min1st, the 1st_loc denoting location information of an input message corresponding to the min1st among input messages of the specific check node, and the 2nd_loc denoting location information of an input message corresponding to the min2nd among the input messages of the specific check node, and $L_n$ denotes an input message for the variable node $v_n$.

11. The physical electronic signal receiving apparatus of claim 7, wherein a decoded output message corresponding to a variable node $v_n(1 \leq n \leq N)$ is expressed as:

$$Q_n=\Sigma_{m' \in M(n)}C_m+L_n$$

where $Q_n$ denotes a decoded output message for an $n^{th}$ node corresponding to the variable node $V_n$, $L_n$ denotes an input message for the variable node $V_n$, and $C_m$ denotes a check node $C_m$ $(1 \leq m \leq M)$.

12. The physical electronic signal receiving apparatus of claim 7, wherein the LDPC code is one of a regular quasi-cyclic (QC) LPDC code and an irregular QC LDPC code.

* * * * *